US008755153B2

United States Patent
Kudo et al.

(10) Patent No.: US 8,755,153 B2
(45) Date of Patent: Jun. 17, 2014

(54) REPRODUCING HEAD WITH SPIN-TORQUE OSCILLATOR, AND MAGNETIC RECORDING AND REPRODUCING APPARATUS

(75) Inventors: Kiwamu Kudo, Kamakura (JP); Tazumi Nagasawa, Yokohama (JP); Koichi Mizushima, Kamakura (JP); Rie Sato, Yokohama (JP); Tao Yang, Yokohama (JP); Hirofumi Suto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/535,785

(22) Filed: Jun. 28, 2012

(65) Prior Publication Data
US 2013/0065086 A1    Mar. 14, 2013

(30) Foreign Application Priority Data

Sep. 12, 2011    (JP) .................................. 2011-198321

(51) Int. Cl.
G11B 5/39    (2006.01)
(52) U.S. Cl.
USPC ....................................................... 360/321
(58) Field of Classification Search
USPC ....................................................... 360/321
See application file for complete search history.

(56) References Cited

U.S. PATENT DOCUMENTS

| | | | |
|---|---|---|---|
| 7,602,588 B2 | 10/2009 | Sato et al. | |
| 8,139,322 B2 * | 3/2012 | Yamada et al. | 360/125.3 |
| 8,164,854 B2 * | 4/2012 | Takagishi et al. | 360/125.31 |
| 8,325,442 B2 * | 12/2012 | Koui et al. | 360/128 |
| 8,351,155 B2 * | 1/2013 | Contreras et al. | 360/125.3 |
| 8,379,352 B1 * | 2/2013 | Braganca et al. | 360/324.2 |
| 8,400,734 B2 * | 3/2013 | Yamada et al. | 360/125.3 |
| 8,446,690 B2 * | 5/2013 | Alex et al. | 360/123.02 |
| 8,446,691 B2 * | 5/2013 | Takagishi et al. | 360/125.3 |
| 8,456,967 B1 * | 6/2013 | Mallary | 369/13.33 |
| 8,467,150 B2 * | 6/2013 | Takeo et al. | 360/125.3 |

FOREIGN PATENT DOCUMENTS

JP    2006-286093    10/2006

OTHER PUBLICATIONS

Mizushima, K., et al; "Signal-to-noise ratios in high-signal-transfer-rate read heads composed of spin-torque oscillators", Journal of Applied Physics,107, 2010.

* cited by examiner

*Primary Examiner* — Mark Blouin
(74) *Attorney, Agent, or Firm* — Amin, Turocy & Watson, LLP (57) ABSTRACT

According to one embodiment, a reproducing head includes a spin-torque oscillator and a pair of shield parts. The spin-torque oscillator has a first surface facing a magnetic recording medium. The pair of shield parts each has a second surface facing the magnetic recording medium, the spin-torque oscillator being arranged between the shield parts. A distance between the second surface and the magnetic recording medium is shorter than a distance between the first surface and the magnetic recording medium.

7 Claims, 7 Drawing Sheets

REPRODUCING HEAD WITH SPIN-TORQUE OSCILLATOR, AND MAGNETIC RECORDING AND REPRODUCING APPARATUS

CROSS-REFERENCE TO RELATED APPLICATIONS

This application is based upon and claims the benefit of priority from prior Japanese Patent Application No. 2011-198321, filed Sep. 12, 2011, the entire contents of which are incorporated herein by reference.

FIELD

Embodiments described herein relate generally to a magnetic reproducing head including a spin-torque oscillator, and a magnetic recording and reproducing apparatus including the magnetic reproducing head.

BACKGROUND

A hard disk drive (hereinafter referred to as an HDD) is an example of a magnetic recording and reproducing apparatus including a magnetic recording medium. In the HDD, a magnetic sensor in a magnetic reproducing head reads out magnetic information recorded on a magnetic disk corresponding to the magnetic recording medium. As the magnetic sensor of the magnetic reproducing head, a magnetoresistance effect sensor such as a GMR sensor or TMR sensor is conventionally used.

The magnetic recording density of the HDD is increasing year by year. The maximum surface recording density of HDDs commercially available in 2011 is about 700 Gbit/in$^2$. According to the HDD technical road maps, the surface recording density will reach 1 Tbit/in$^2$ in about 2013, and 2 Tbit/in$^2$ in about 2015.

Increasing the surface recording density is equal to decreasing the size of a medium bit in the magnetic disk. The size of the magnetic sensor must be decreased so as to match the medium bit size. When the medium bit size and magnetic sensor size further decrease in the future, noise in reproduced signals increases, and this makes the conventional magnetoresistance effect sensors unable to secure a practical signal-to-noise ratio. The main causes that decrease the signal-to-noise ratio are, e.g., thermal mag-noise and inter-bit interference noise. The thermal mag-noise is noise caused by the thermal fluctuation of magnetization of a magnetic layer in the magnetic sensor. The inter-bit interference noise is noise caused when a magnetic field generated by a medium bit other than a target bit, which is a medium bit to be read out, acts on the magnetic sensor.

As a magnetic sensor capable of suppressing the thermal mag-noise, a spin-torque oscillator magnetic sensor using the spin transfer effect has been proposed. The spin-torque oscillator (STO) has as its basic structure a multilayered film in which a magnetization free layer, a spacer layer, and a ferromagnetic layer (e.g., a magnetization pinned layer) are sequentially stacked. When an electric current is supplied to the spin-torque oscillator, the magnetization pinned layer spin-polarizes the electric current, and the spin-polarized electric current makes magnetization in the magnetization free layer oscillate stably. A magnetic reproducing head using the spin-torque oscillator as a magnetic sensor (this head is also called a reproducing head with a spin-torque oscillator, and will be hereinafter referred to as an STO reproducing head) can read out information from the magnetic recording medium by using a phenomenon in which the amplitude and frequency of magnetization oscillation depend on an external magnetic field acting on the spin-torque oscillator. When the oscillatory energy of magnetization is much higher than the thermal energy, the thermal fluctuation of magnetization is relatively suppressed. Accordingly, it is possible to avoid the problem of the thermal mag-noise by using the spin-torque oscillator as the magnetic sensor.

On the other hand, the inter-bit interference noise may be suppressed by forming magnetic shields so as to absorb magnetic fields from medium bits other than a target bit. The magnetic shields are provided such that the magnetic sensor is positioned therebetween. The decrease of the medium bit size may be dealt with by decreasing the gap between the magnetic shields. Since the magnetic sensor is arranged between the magnetic shields, however, the gap between the magnetic shields cannot be set smaller than the thickness of the multilayered film of the magnetic sensor. This limits the suppression of the inter-bit interference noise by decreasing the gap between the magnetic shields.

As described above, the problem of the thermal mag-noise may be avoided by using the spin-torque oscillator as the magnetic sensor, but the reduction in inter-bit interference noise is limited. Therefore, the STO reproducing head is required to be able to reduce the inter-bit interference noise in a reproduced signal.

DETAILED DESCRIPTION

According to one embodiment, a reproducing head includes a spin-torque oscillator and a pair of shield parts. The spin-torque oscillator has a first surface facing a magnetic recording medium. The pair of shield parts each has a second surface facing the magnetic recording medium, the spin-torque oscillator being arranged between the shield parts. A distance between the second surface and the magnetic recording medium is shorter than a distance between the first surface and the magnetic recording medium.

Embodiments described herein provide an STO reproducing head and magnetic recording and reproducing apparatus capable of reducing the inter-bit interference noise in a reproduced signal.

A reproducing head with a spin-torque oscillator, and magnetic recording and reproducing apparatus according to embodiments will be explained below with reference to the accompanying drawings as needed. In the following embodiments, the reproducing head with the spin-torque oscillator will be simply referred to as an STO reproducing head. In the embodiments, like reference numbers denote like elements, and duplication of explanation will be avoided.

First Embodiment

Figure 1:
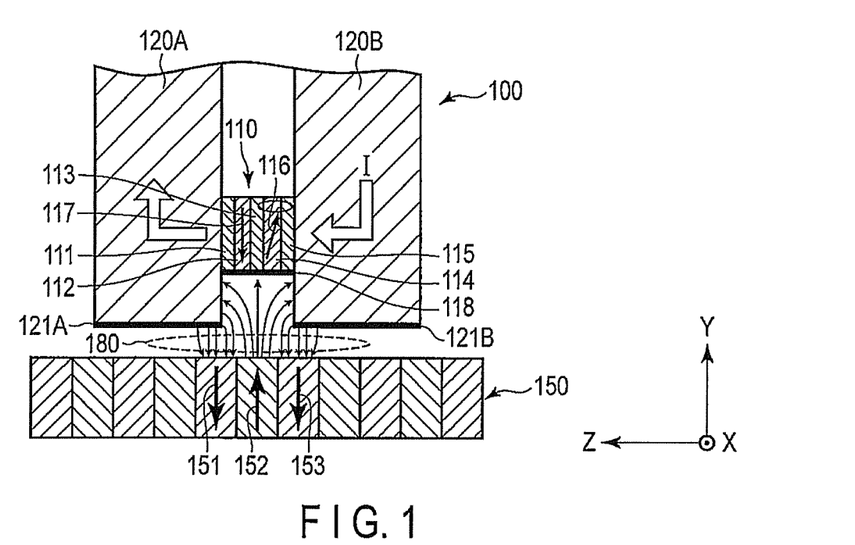
FIG. 1 is a sectional view schematically showing an STO reproducing head according to the first embodiment.

FIG. 1 schematically shows an STO reproducing head 100 according to a first embodiment. The STO reproducing head 100 is used to reproduce information recorded on a magnetic recording medium 150. An example of the magnetic recording medium 150 is a magnetic disk included in a HDD. The present embodiment will be explained by taking a case in which the STO reproducing head 100 is applied to the HDD as an example. The magnetic recording medium 150 of the present embodiment is a magnetic disk.

On the magnetic recording medium 150, a plurality of circular tracks are formed along the radial direction from the center. Medium bits (e.g., medium bits 151, 152, and 153) are arranged at equal intervals on each of these tracks. The medium bits can be arranged at different intervals on different tracks.

To simplify the explanation, X-, Y-, and Z-directions are defined as shown in FIG. 1. The Z-direction is a track direction, the X-direction is a cross-track direction (or the radial direction), and the Y-direction is a direction perpendicular to the surface (or the recording surface) of the magnetic recording medium 150. Furthermore, the vertical direction is defined along the Y-direction by assuming that the STO reproducing head 100 is the upside, and the magnetic recording medium 150 is the downside.

The magnetic recording medium 150 shown in FIG. 1 is a perpendicular magnetic recording medium having an axis of easy magnetization in the direction perpendicular to the recording surface. The medium bit holds information corresponding to the magnetization direction. For example, the medium bit 152 whose magnetization direction is upward holds information "0", and the medium bits 151 and 153 whose magnetization direction is downward hold information "1". In addition, the medium bit generates a medium magnetic field corresponding to the magnetization direction. The STO reproducing head 100 can read out information held in a medium bit by detecting a medium magnetic field from the medium bit which acts on a spin-torque oscillator 110.

When reproducing information, a rotating mechanism (not shown) rotates the magnetic recording medium 150, i.e., the STO reproducing head 100 relatively moves in the Z-direction. Consequently, the medium magnetic field acting on the spin-torque oscillator 110 momentarily changes. The STO reproducing head 100 can read out information one after another from the magnetic recording medium 150 by detecting the momentarily changing medium magnetic field.

In the present embodiment, a medium bit to be read out which is positioned immediately below the STO reproducing head 100 will be called a target bit. Also, medium bits positioned around the target bit will be called adjacent bits. Referring to FIG. 1, the target bit is the medium bit 152, and the adjacent bits include the medium bits 151 and 153.

Note that the magnetic recording medium 150 is not limited to a magnetic disk of a hard disk drive, and may also be another arbitrary magnetic recording medium. Furthermore, the magnetic recording medium 150 is not limited to a perpendicular magnetic recording medium, and may also be an in-plane magnetic recording medium having an axis of easy magnetization in a direction parallel to the recording surface.

The STO reproducing head 100 shown in FIG. 1 includes the spin-torque oscillator 110 and a pair of shield films (also called magnetic shields) 120A and 120B. The spin-torque oscillator 110 is arranged between the shield films 120A and 120B. The spin-torque oscillator 110 has a medium-facing surface 118 facing the surface of the magnetic recording medium 150. Also, the shield films 120A and 120B respectively have medium-facing surfaces 121A and 121B facing the surface of the magnetic recording medium 150. The shield film is not always called a film because the thickness is large. In this specification, the shield film will sometimes be called a shield part.

The distance between each of the medium-facing surfaces 121A and 121B and the surface of the magnetic recording medium 150 is smaller than that between the medium-facing surface 118 and the surface of the magnetic recording medium 150. That is, the magnetic recording medium 150 is closer to the medium-facing surface 121A and 121B than to the medium-facing surface 118. The distance in the Y-direction between each of the medium-facing surfaces 121A and 121B and the medium-facing surface 118 is appropriately determined in accordance with, e.g., the strength of a magnetic field generated by a medium bit of the magnetic recording medium 150, and the material and shape of the shield films 120A and 120B.

The spin-torque oscillator 110 has a multilayered structure (or multilayered film) including an oscillation layer 114. More specifically, the spin-torque oscillator 110 includes a nonmagnetic layer 111, a ferromagnetic layer 112 stacked on the nonmagnetic layer 111, a spacer layer 113 stacked on the ferromagnetic layer 112, the oscillation layer 114 stacked on the spacer layer 113, and a nonmagnetic layer 115 stacked on the oscillation layer 114.

The spacer layer 113 is made of a nonmagnetic metal such as copper, or a nonmagnetic insulator such as magnesium oxide or alumina. When the spacer layer 113 is made of a nonmagnetic metal, the multilayered structure of the spin-torque oscillator 110 is the same as that of a so-called giant magnetoresistance effect (GMR) element or current-perpendicular-to-plane (CPP)-GMR element. When the spacer layer 113 is made of a nonmagnetic insulator, the multilayered structure of the spin-torque oscillator 110 is the same as that of a tunnel magnetoresistance effect (TMR) element.

The ferromagnetic layer 112 is made of a metal such as iron (Fe), cobalt (Co), or nickel (Ni), an alloy including at least one of iron, cobalt, and nickel, or the like. The ferromagnetic layer 112 of the present embodiment has magnetization 117 fixed in the direction parallel to the film surface of the multilayered film. In this specification, a surface perpendicular to the direction (stacking direction) in which the nonmagnetic layer 111, ferromagnetic layer 112, spacer layer 113, oscillation layer 114, and ferromagnetic layer 115 are stacked will be called a film surface.

The oscillation layer (also called magnetization free layer) 114 is made of a metal such as iron, cobalt, or nickel, an alloy including at least one of iron, cobalt, and nickel, or the like. The oscillation layer 114 has magnetization 116, and the direction of the magnetization 116 is variable. The nonmagnetic layers 111 and 115 are made of a nonmagnetic metal.

The shield films 120A and 120B absorb magnetic fields generated from the adjacent bits 151 and 153, such that most of a magnetic field acting on the spin-torque oscillator 110 is a magnetic field generated from the target bit 152. That is, the shield films 120A and 120B function as magnetic shields for preventing the magnetic fields from the adjacent bits 151 and 153 from acting on the spin-torque oscillator 110. As indicated by lines of magnetic force 180 in FIG. 1, the shield films 120A and 120B absorb magnetic fields from the medium bits. The shield films 120A and 120B are made of a soft magnetic metal such as permalloy having a large magnetic permeability.

Furthermore, the shield films 120A and 120B function as a pair of electrodes for supplying an electric current to the spin-torque oscillator 110. The spin-torque oscillator 110 oscillates when a direct current I is supplied through the pair of shield films 120A and 120B. A power source (not shown) supplies the direct current I to the spin-torque oscillator 110. The ferromagnetic layer 112 functions as a spin filter for the direct current I. The direct current I having passed through the ferromagnetic layer 112 functions as a spin-polarized current for the oscillation layer 114, and causes spin torque (also called spin transfer torque) to act on the magnetization 116 of the oscillation layer 114. As a consequence, the magnetization 116 exhibits a steady oscillation.

More specifically, the direct current I is supplied perpendicularly to the film surface of the multilayered film of the spin-torque oscillator 110. In the present embodiment, the electric current I flows from the nonmagnetic layer 115 to the nonmagnetic layer 111 as indicated by arrows in FIG. 1. That is, electrons move from the nonmagnetic layer 111 to the nonmagnetic layer 115. These electrons are spin-polarized by the magnetization 117 in the ferromagnetic layer 112. The spin-polarized electrons are injected into the oscillation layer 114 via the spacer layer 113. The spin-polarized electrons act on the magnetization in the oscillation layer 114, and induce precession of the magnetization 116 in the oscillation layer 114. Thus, the magnetization 116 exhibits a steady oscillation during the direct current I flowing.

While the magnetization 116 is oscillating, the relative angle between the magnetization 116 and magnetization 117 momentarily changes. This change in relative angle between the magnetization 116 and magnetization 117 changes the resistance of the spin-torque oscillator 110 by the magnetoresistance effect. Accordingly, the resistance of the spin-torque oscillator 110 changes in accordance with the change in relative angle between the magnetization 116 and magnetization 117. This produces an alternating-current (AC) component in the voltage between the shield films 120A and 120B. A high-frequency circuit (not shown) extracts this AC component of the voltage, thereby obtaining a high-frequency voltage (or oscillatory voltage). The spin-torque oscillator 110 thus outputs the high-frequency voltage.

The frequency of the voltage output is equivalent to the oscillating frequency of the magnetization 116, and depends on, e.g., the size and film thickness of the oscillation layer 114. In addition, the frequency of the voltage output also depends on an external magnetic field, and hence depends on a magnetic field from a medium bit as well. Accordingly, the magnetization direction of a medium bit can be detected by measuring the frequency of the voltage output.

The STO reproducing head 100 performs a medium bit read operation while the spin-torque oscillator 110 is in an oscillation state by the direct current I. That is, while the spin-torque oscillator 110 is oscillating and moving to the Z-direction above the magnetic recording medium 150, the STO reproducing head 100 detects medium magnetic fields from medium bits one after another. The medium magnetic field is detected by sensing the change in frequency (or phase) of the voltage output.

More specifically, FIG. 1 is an exemplary view showing the state in which the STO reproducing head 100 reads the target bit 152. In the STO reproducing head 100 as described previously, the distance between each of the medium-facing surfaces 121A and 121B and the surface of the magnetic recording medium 150 is smaller than that between the medium-facing surface 118 and the surface of the magnetic recording medium 150. In this case, the shield films 120A and 120B absorb medium magnetic fields larger than those absorbed when the distance between each of the medium-facing surfaces 121A and 121B and the surface of the magnetic recording medium 150 is the same as that between the medium-facing surface 118 and the surface of the magnetic recording medium 150. The shield films 120A and 120B absorb the most of magnetic fields from adjacent bits including the medium bits 151 and 153. This makes it possible to selectively detect the magnetic field from the target bit 152. Consequently, it is possible to suppress the inter-bit interference noise in the voltage output corresponding to a reproduced signal.

Figure 2:
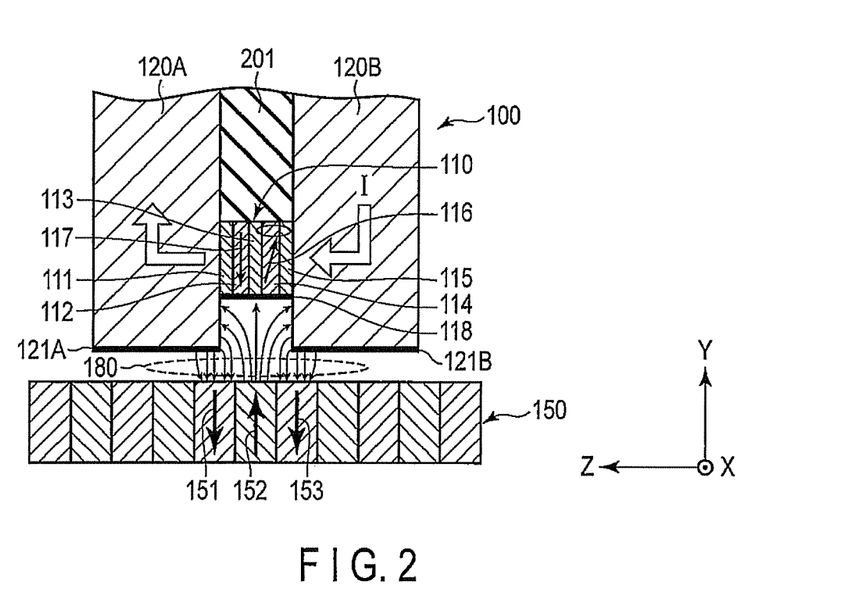
FIG. 2 is a sectional view showing an example in which an insulating layer is formed on a spin-torque oscillator shown in FIG. 1.

Note that FIG. 1 does not particularly illustrate the structure of a portion above the spin-torque oscillator 110, but this portion can be either a free space or insulating layer. FIG. 2 shows an example in which an insulating layer 201 is formed in a portion above the spin-torque oscillator 110 and between the shield films 120A and 120B. The insulating layer 201 is formed of a magnetically nonreactive nonmagnetic material.

In the present embodiment, the shield films 120A and 120B partially absorb the magnetic field from the target bits 152 together with the magnetic fields from the adjacent bits 151 and 153. Therefore, the medium magnetic field from the target bit 152 acting on the oscillation layer 114 also decreases. However, even when the magnetic field from the target bit 152 acting on the oscillation layer 114 decreases, the frequency (or phase) of the voltage output sufficiently changes. This will be explained below.

First, it will be explained, with reference to FIG. 3, that the medium magnetic field acting on the oscillation layer 114 decreases as the distance between the spin-torque oscillator 110 and magnetic recording medium 150 increases.

Figure 3:
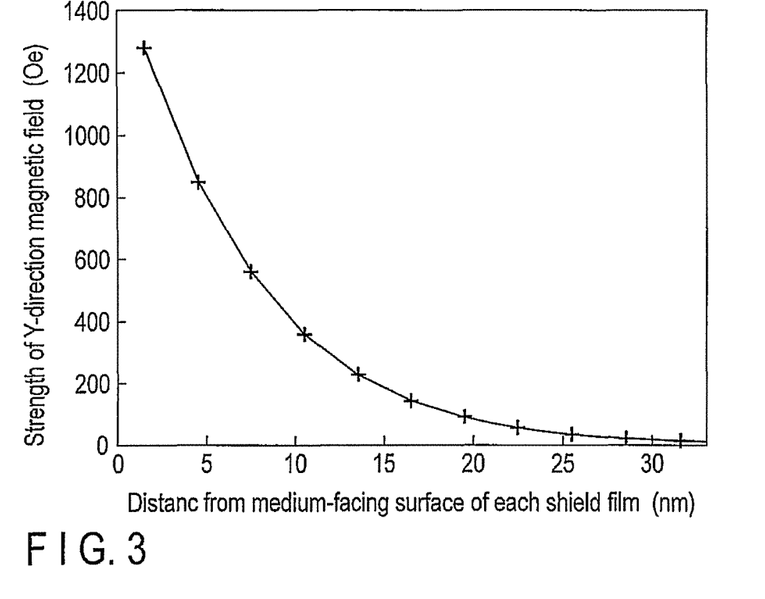
FIG. 3 is a graph showing the distance dependence of the strength of a magnetic field acting on the spin-torque oscillator shown in FIG. 1.

FIG. 3 shows the calculation result of the dependence of the medium magnetic field acting on the oscillation layer 114 on the distance from the medium-facing surface of the shield film. The calculation is performed by micro-magnetic simulation. The target bit is an upward medium bit like the medium bit 152 shown in FIG. 1, and the Y-direction component of the medium magnetic field acting on the oscillation layer 114 is calculated. Referring to FIG. 3, the transverse axis represents the distance between the medium-facing surface of the shield film and that of the spin-torque oscillator, and the vertical axis represents the strength of the Y-direction component of the magnetic field acting on the oscillation layer.

In this simulation, the medium bit size is $27 \times 9 \times 12$ nm$^3$, and saturation magnetization Ms of the medium bit is 600 emu/cm$^3$. Also, the distance between the shield films (i.e., the shield gap) is 15 nm, and the distance between the surface of the magnetic recording medium and the medium-facing surface of each shield film is 6 nm. Furthermore, the material of the shield film is assumed to be permalloy, and a saturation magnetization of 800 emu/cm$^3$ is used for the shield film.

The simulation result shown in FIG. 3 demonstrates that the medium magnetic field acting on the spin-torque oscillator decreases as the distance between the medium-facing surface of the spin-torque oscillator and that of each shield film increases. For example, when a spin-torque oscillator having a size of about 20 nm is set apart by about 15 nm from the medium-facing surface of each shield film, an average medium magnetic field of approximately 50 Oe acts on the spin-torque oscillator.

Next, it will be explained that the frequency (or phase) of the output voltage of the spin-torque oscillator sufficiently changes even when the magnetic field acting on the oscillation layer 114 is small.

The present inventors makes a spin-torque oscillator by using an MgO/CoFeB-based TMR film, and measures the frequency change of the spin-torque oscillator by applying a pulse magnetic field of about 60 Oe to the spin-torque oscillator. It is confirmed by the measurement result that the frequency of the spin-torque oscillator shows a sufficiently large change of 400 MHz/60 Oe. This experiment will be explained in detail below.

The spin-torque oscillator used in the experiment is processed into a pillar having an elliptic film surface shape. This ellipse had a major axis of 210 nm, and a minor axis of 120 nm. In this spin-torque oscillator, the oscillation layer is a CoFeB film (3 nm), and the spacer layer is an MgO film (0.85 nm). Furthermore, the ferromagnetic layer is a multilayered film of CoFeB (3 nm)/Ru (0.95 nm)/CoFe (2.5 nm). The element resistance is 164Ω, and the magnetoresistance ratio is 73%. When an in-plane magnetic field of about 290 Oe is applied to the spin-torque oscillator and a direct current of 0.7 mA is supplied to it, the magnetization of the oscillation layer oscillated at a frequency of about 3.5 GHz.

To apply a pulse magnetic field to the spin-torque oscillator, a transmission line for generating a pulse magnetic field is formed immediately above the spin-torque oscillator. When a voltage of about 0.45 V is applied to the transmission line, a magnetic field of about 60 Oe acted on the spin-torque oscillator from the transmission line. While the magnetization of the oscillation layer is oscillating at a frequency of about 3.5 GHz, a pulse magnetic field having a magnitude of about 60 Oe, a rise time of 0.3 ns, and a width of 1 ns is applied. Consequently, the voltage output of the spin-torque oscillator changed following the pulse magnetic field.

Figure 4A:
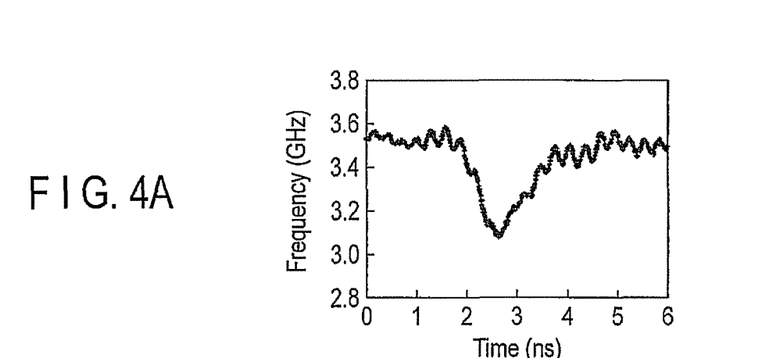
FIG. 4A is a graph showing the measurement result of the frequency change of the spin-torque oscillator shown in FIG. 1.
Figure 4B:
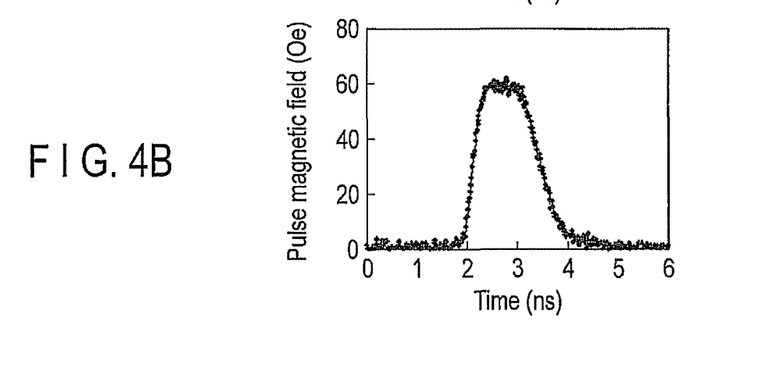
FIG. 4B is a graph showing a pulse magnetic field applied to the spin-torque oscillator shown in FIG. 1.

FIGS. 4A and 4B show the results of the above experiment. More specifically, FIG. 4B shows the pulse magnetic field applied to the spin-torque oscillator, and FIG. 4A shows the voltage output of the spin-torque oscillator when the pulse magnetic field shown in FIG. 4B is applied. FIGS. 4A and 4B reveal that when a pulse magnetic field of about 60 Oe is applied, the frequency of the spin-torque oscillator changed from about 3.5 GHz to about 3.1 GHz. Note that FIG. 4A plots an instantaneous frequency obtained by performing Hilbert transformation on the measurement data of the output from the spin-torque oscillator.

From the foregoing, even a small medium magnetic field of about 50 Oe sufficiently changes the frequency (or phase) of the spin-torque oscillator. That is, the STO reproducing head 100 according to the first embodiment can sufficiently detect a medium magnetic field of about 50 Oe. Note that a conventional magnetic reproducing head including a GMR sensor or TMR sensor requires about 500 Oe as the magnitude of the medium magnetic field in order to ensure the reproduction sensitivity. Accordingly, a medium magnetic field of about 50 Oe described above is much smaller than the medium magnetic field that required in the conventional magnetic reproducing head techniques.

As described above, in the STO reproducing head according to the present embodiment, the spin-torque oscillator is arranged between the shield films such that the distance between the medium-facing surface of each shield film and the surface of the magnetic recording medium is smaller than the distance between the medium-facing surface of the spin-torque oscillator and the surface of the magnetic recording medium. This enables the spin-torque oscillator to efficiently detect a magnetic field from a target bit of the magnetic recording medium. As a result, the inter-bit interference noise in a reproduced signal can be reduced.

Note that the spin-torque oscillator is not limited to the spin-torque oscillator having the multilayered structure shown in FIG. 1, and may also be another arbitrary spin-torque oscillator. For example, the ferromagnetic layer 112 may also be a free layer having a variable magnetization direction. When the ferromagnetic layer 112 is a free layer, it is possible to make the magnetization 117 of the ferromagnetic layer 112 and the magnetization 116 of the oscillation layer 114 oscillate synchronously, by supplying the direct current I to the spin-torque oscillator 110. The frequency of the voltage output changes in accordance with an external magnetic field (or a magnetic field from a medium bit) in this case as well.

Furthermore, information can also be read out from the magnetic recording medium by using a method of detecting the phase change of the voltage output, instead of the method of detecting the frequency change of the voltage output.

Second Embodiment

Figure 5:
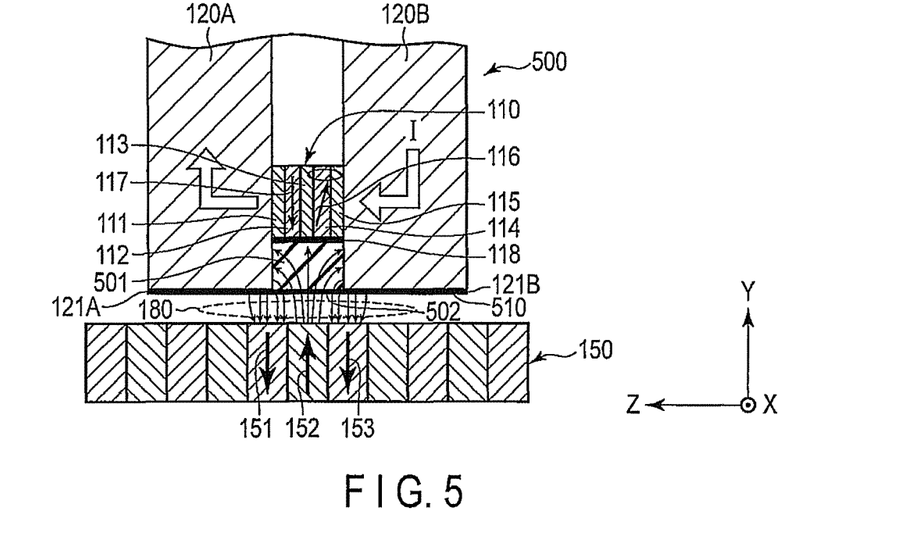
FIG. 5 is a sectional view schematically showing an STO reproducing head according to the second embodiment.

FIG. 5 schematically shows an STO reproducing head 500 according to a second embodiment. The STO reproducing head 500 includes an insulating layer 501 in a portion or space positioned below a medium-facing surface 118 of a spin-torque oscillator 110, and partially enclosed by shield films 120A and 120B. The insulating layer 501 is made of a magnetically nonreactive nonmagnetic material.

In the present embodiment, a medium-facing surface 502 of the insulating layer 501, a medium-facing surface 121A of the shield film 120A, and a medium-facing surface 121B of the shield film 120B are on the same plane, forming a medium-facing surface 510 of the STO reproducing head 500. The medium-facing surface 510 is flat like the medium-facing surfaces of a conventional CPP-GMR head and TMR head. That is, the medium-facing surface 502 is flush with the medium-facing surfaces 121A and 121B. Forming the flat medium-facing surface 510 of the STO reproducing head 500 by the insulating layer 501 has meaning in respect of fluid dynamics as will be explained below.

In an HDD, an air stream generated by the rotation of a magnetic disk floats a magnetic head with a predetermined floating amount from the surface of the magnetic disk. Since the magnetic head thus floats, the medium-facing surface of the magnetic head is also called an air bearing surface (ABS). When the medium-facing surface of the magnetic head is flat, the magnetic head can stably float. Therefore, the medium-facing surface of the magnetic head is preferably flat.

The STO reproducing head according to the present embodiment includes a flat medium-facing surface. Accordingly, a magnetic recording and reproducing apparatus including the STO reproducing head of the present embodiment can stably float the STO reproducing head during magnetic reproduction.

Third Embodiment

Figure 6:
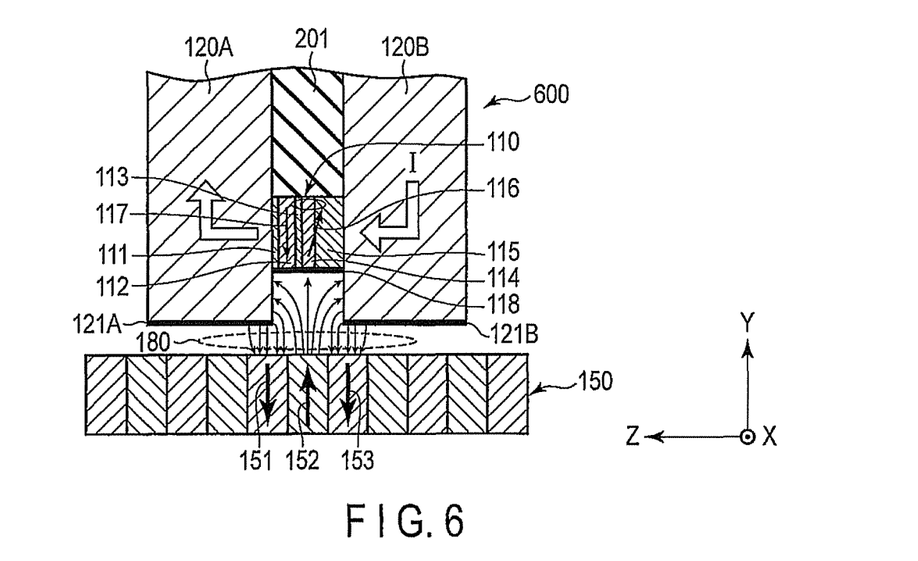
FIG. 6 is a sectional view schematically showing an STO reproducing head according to the third embodiment.

FIG. 6 schematically shows an STO reproducing head 600 according to a third embodiment. In the STO reproducing head 600, an oscillation layer 114 is positioned in almost the center between shield films 120A and 120E. That is, the oscillation layer 114 is formed in a position spatially farthest from the shield films 120A and 120B. When the oscillation layer 114 is positioned in the center between the shield films 120A and 120B, the magnetic field absorbing effect of the shield film is smallest, so a medium magnetic field acting on the oscillation layer 114 increases.

In the STO reproducing head according to the present embodiment, the oscillation layer is positioned in the center between the shield films, so a medium magnetic field from a target bit can efficiently act on the oscillation layer.

Fourth Embodiment

Figure 7:
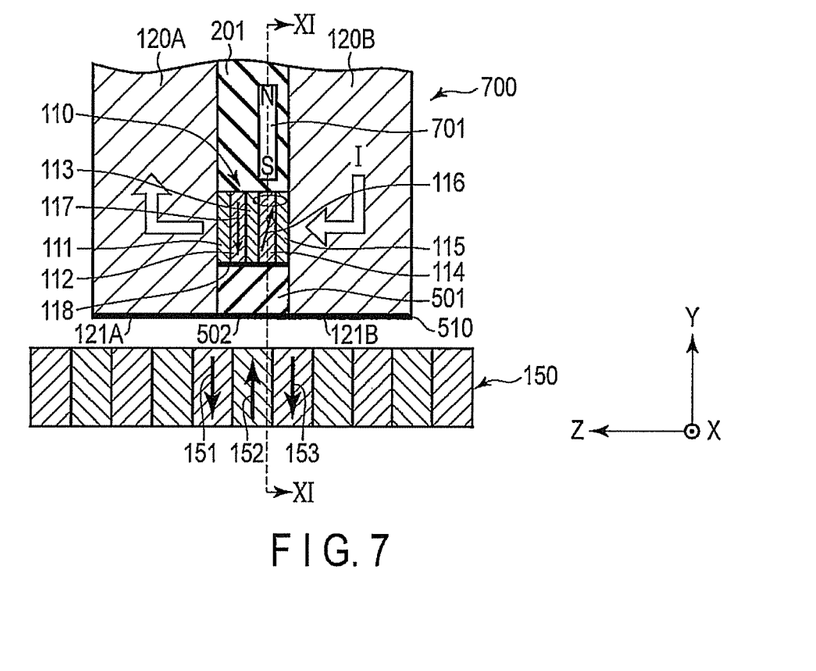
FIG. 7 is a sectional view schematically showing an STO reproducing head according to the fourth embodiment.

FIG. 7 schematically shows an STO reproducing head 700 according to a fourth embodiment. The STO reproducing head 700 includes a bias magnetic field source 701 for applying a bias magnetic field to an oscillation layer 114 of a spin-torque oscillator 110, in addition to the arrangement of the STO reproducing head 100 shown in FIG. 2. In FIG. 7, the bias magnetic field source 701 is formed above the oscillation layer 114. The bias magnetic field source 701 applies a bias magnetic field to the oscillation layer 114 such that the oscillation center direction of magnetization 116 of the oscillation layer 114 is a direction (a Y-direction or −Y-direction) perpendicular to the surface of a magnetic recording medium 150. Accordingly, the oscillation center direction of the magnetization 116 is almost parallel to the direction of a medium magnetic field from a target bit 152 acting on the spin-torque oscillator 110.

When the oscillation center direction of the magnetization 116 and the direction of the medium magnetic field acting on the spin-torque oscillator 110 are parallel, the medium magnetic field from the target bit 152 increases the instantaneous frequency (or phase) change of the magnetization 116. Accordingly, the reproduction sensitivity can be increased by applying a bias magnetic field to the oscillation layer 114.

Figure 8:
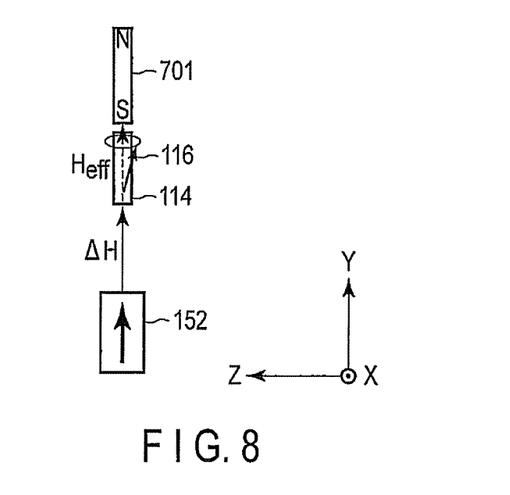
FIG. 8 is a schematic view selectively showing an oscillation layer, target bit, and bias magnetic field source shown in FIG. 7.

Next, it will be explained, with reference to FIG. 8, that the medium magnetic field from the target bit 152 increases the instantaneous frequency (or phase) change of the magnetization 116 when the oscillation center direction of the magnetization 116 and the direction of the medium magnetic field acting on the spin-torque oscillator 110 are parallel. FIG. 8 selectively shows the oscillation layer 114, target bit 152, and bias magnetic field source 701 of the STO reproducing head 700 shown in FIG. 7. When no medium magnetic field from any medium bit including the target bit 152 acts, the oscillating frequency of the magnetization 116 of the oscillation layer 114 is represented by $\gamma H_{eff}/2\pi$ where $\gamma$ is the gyromagnetic ratio, and $H_{eff}$ is the effective magnetic field acting on the magnetization 116 in the oscillation center direction. The effective magnetic field $H_{eff}$ depends on an external magnetic field, magnetic anisotropic field, and demagnetizing field. The external magnetic field includes the bias magnetic field from the bias magnetic field source 701.

When a medium magnetic field $\Delta H$ from the target bit 152 acts on the oscillation layer 114, the oscillating frequency instantaneously changes to $\gamma(H_{eff}+\Delta H)/2\pi$. This is so because the magnetization 116 of the oscillation layer 114 oscillates around a central axis in a direction parallel to the direction of the medium magnetic field $\Delta H$ from the target bit 152, so the amplitude change (or amplitude relaxing process) of the magnetization 116 does not instantaneously occur due to the medium magnetic field $\Delta H$. On the other hand, when the oscillation center direction of the magnetization 116 shifts by an angle from the direction of the medium magnetic field $\Delta H$ from the target bit 152, the oscillating frequency changes from $\gamma H_{eff}/2\pi$ to $\gamma(H_{eff}+\Delta H \cos \theta)/2\pi$. Thus, when the oscillation center direction of the magnetization 116 is parallel to the direction of the medium magnetic field from the target bit 152, the medium magnetic field from the target bit 152 increases the instantaneous frequency change of the magnetization 116. This enables the medium magnetic field from the target bit 152 to effectively contribute to the instantaneous frequency change of the magnetization 116.

As described above, the STO reproducing head according to the present embodiment includes the bias magnetic field source that applies a bias magnetic field to the oscillation layer such that the oscillation center direction of the magnetization of the oscillation layer is parallel to the magnetization direction of a medium bit. Since this increases the frequency change of the voltage output, the medium magnetic field from a medium bit is readily detectable.

Figure 9:
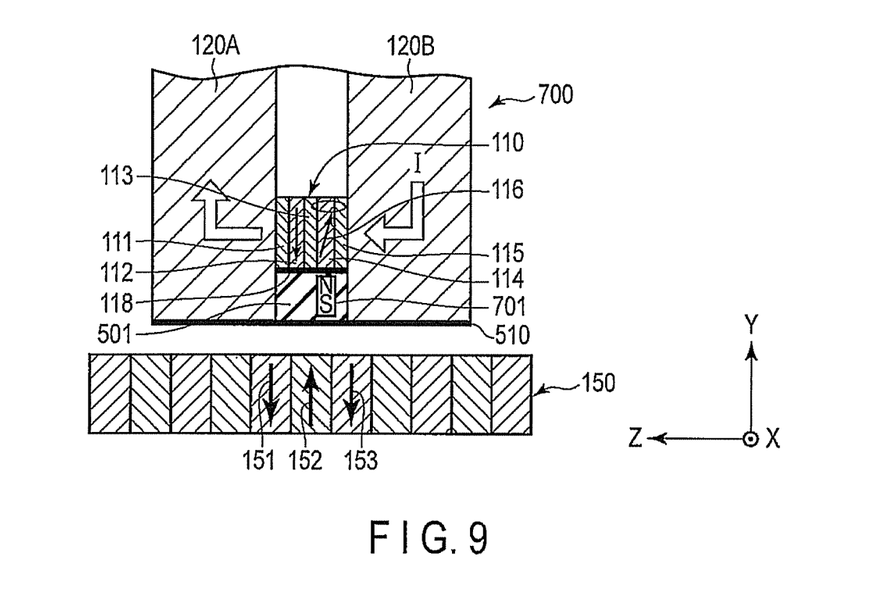
FIG. 9 is a sectional view schematically showing an STO reproducing head according to a modification of the fourth embodiment.
Figure 10:
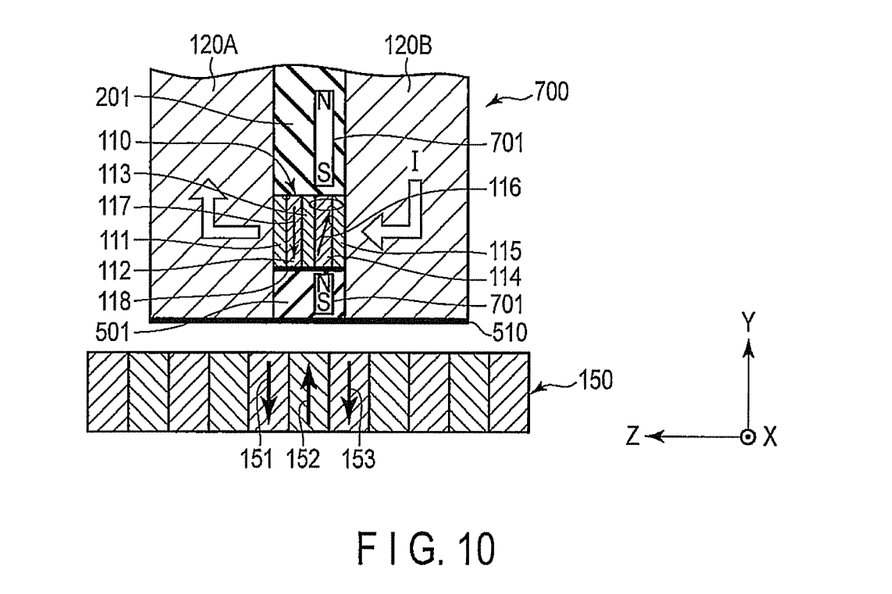
FIG. 10 is a sectional view schematically showing an STO reproducing head according to another modification of the fourth embodiment.

Note that the bias magnetic field source 701 need not be formed above the spin-torque oscillator 110 as shown in FIG. 7, and can be formed in any place as long as a bias magnetic field can be applied to the oscillation layer 114 so that the oscillation center direction of the magnetization 116 of the oscillation layer 114 is perpendicular to the surface of the magnetic recording medium 150. For example, as shown in FIG. 9, the bias magnetic field source 701 may also be formed below the oscillation layer 114. Furthermore, as shown in FIG. 10, the bias magnetic field sources 701 may also be formed above and below the oscillation layer 114.

Modification of Fourth Embodiment

An STO reproducing head according to a modification of the fourth embodiment will be explained below with reference to FIGS. 11 and 12.

Figure 11:
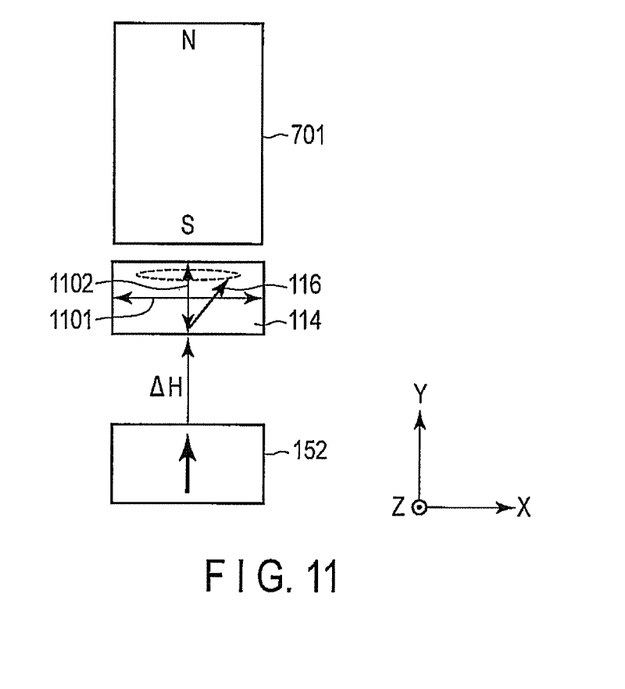
FIG. 11 is a sectional view of the STO reproducing head taken along line XI-XI in FIG. 7.

FIG. 11 is a sectional view of the oscillation layer 114 taken along a line XI-XI shown in FIG. 7. In FIG. 11, the insulating layer is omitted. In this example shown in FIG. 11, the cross-sectional shape of the oscillation layer 114 is a rectangle. That is, the film surface of the oscillation layer 114 has two axes (a major axis 1101 and minor axis 1102) having different lengths. The major axis 1101 is defined in the longitudinal direction of the film surface of the oscillation layer 114, and the minor axis 1102 is defined along the lateral direction of the film surface. When the cross-sectional (film surface) shape of the oscillation layer 114 is rectangular, the major axis 1101 and minor axis 1102 are perpendicular to each other. Note that the cross-sectional shape of the oscillation layer 114 may also be an ellipse or the like. The oscillation layer 114 is formed such that the minor axis 1102 is parallel to a direction (the Y-direction) in which the medium magnetic field $\Delta H$ acts. When the oscillation layer 114 is formed such that the minor axis 1102 is parallel to the direction in which the medium magnetic field $\Delta H$ acts, it is possible to increase an oscillating frequency change amount $|\Delta f/\Delta H|$ of the magnetization 116 of the oscillation layer 114 due to the medium magnetic field H. This allows a medium magnetic field from a target bit to effectively contribute to the instantaneous frequency change of the magnetization 116.

Next, it will be explained that the above-mentioned arrangement increases the oscillating frequency change amount |Δf/ΔH| of the magnetization 116 of the oscillation layer 114, which is due to the medium magnetic field ΔH.

When the oscillation layer 114 as a thin film is formed into an anisotropic shape having two axes such as an ellipse or rectangle, an effective in-plane magnetic anisotropic field $H_{an}$ acts on the magnetization 116 of the oscillation layer 114. In addition, an effective demagnetizing field $4\pi M_{eff}$ in a direction perpendicular to the film surface also acts on the magnetization 116 of the oscillation layer 114 because it is a thin film.

When the medium magnetic field ΔH acts in the major-axis direction of the oscillation layer 114, a phenomenological equation (Landau-Lifshitz-Gilbert equation) describing the magnetization dynamics shows that an oscillating frequency change Δf/ΔH is approximately given by $$\frac{\Delta f}{\Delta H} \simeq \frac{\gamma}{2\pi} \frac{H_0 + H_{an} + 2\pi M_{eff}}{\sqrt{(H_0 + H_{an})(H_0 + H_{an} + 4\pi M_{eff})}} \quad (1)$$

On the other hand, when the medium magnetic field ΔH acts in the minor-axis direction of the oscillation layer 114, the oscillating frequency change Δf/ΔH is approximately given by $$\frac{\Delta f}{\Delta H} \simeq \frac{\gamma}{2\pi} \frac{H_0 - H_{an}/2 + 2\pi M_{eff}}{\sqrt{(H_0 - H_{an})(H_0 + 4\pi M_{eff})}} \quad (2)$$

Figure 12:
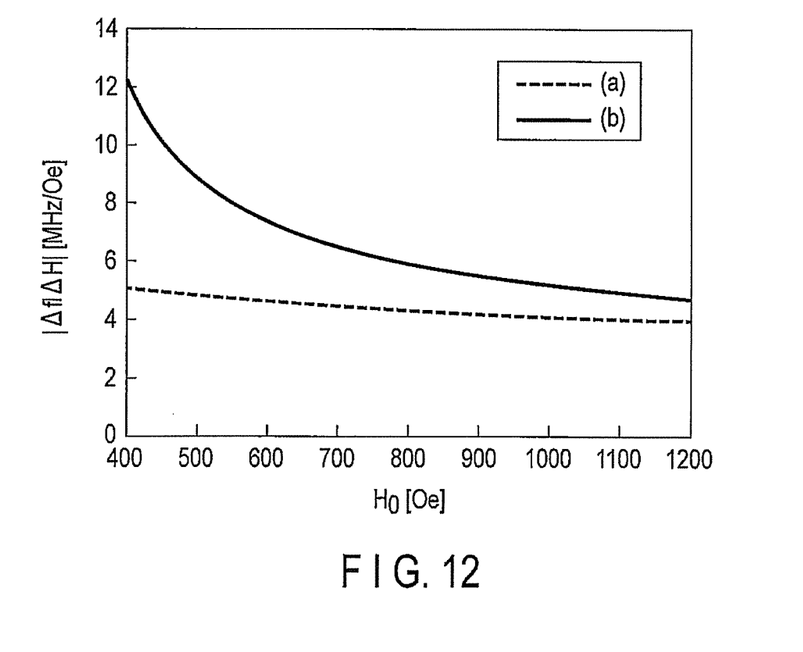
FIG. 12 is a graph showing oscillating frequency change amounts as functions of a bias magnetic field from the bias magnetic field source shown in FIG. 7.

FIG. 12 is a graph plotting expressions (1) and (2). Referring to FIG. 12, the transverse axis represents a bias magnetic field $H_0$ from the bias magnetic field source. In FIG. 12, the in-plane magnetoanisotropic magnetic field $H_{an}$ is 300 Oe, and the demagnetizing field $4\pi M_{eff}$ is 7,000 Oe. A broken line (a) represents the oscillating frequency change amount when the medium magnetic field ΔH acts in the major-axis direction of the oscillation layer 114. Also, a solid line (b) represents the oscillating frequency change amount when the medium magnetic field ΔH acts in the minor-axis direction of the oscillation layer 114. FIG. 12 shows that the oscillating frequency change amount increases when the medium magnetic field ΔH acts in the minor-axis direction of the oscillation layer 114. Note that the oscillation layer 114 may also be formed at, e.g., a rotational angle of 45° around an axis in the Z-direction. However, the oscillating frequency change amount |Δf/ΔH| is maximum when the medium magnetic field ΔH acts in the minor-axis direction.

Accordingly, when the oscillation layer is formed into a shape having two axes different in length such that the minor axis of the oscillation layer is parallel to the direction in which the medium magnetic field ΔH acts, the medium magnetic field from the target bit can effectively contribute to the instantaneous frequency change of the magnetic field.

As described above, the STO reproducing heads according to the present embodiment and its modification include the bias magnetic field source that makes the oscillation center direction of the magnetization in the oscillation layer almost parallel to a medium magnetic field from a target bit, and can efficiently detect the medium magnetic field from the target bit.

Fifth Embodiment

In a fifth embodiment, an example of a magnetic recording and reproducing apparatus including the STO reproducing head according to each embodiment described above will be explained.

Figure 13:
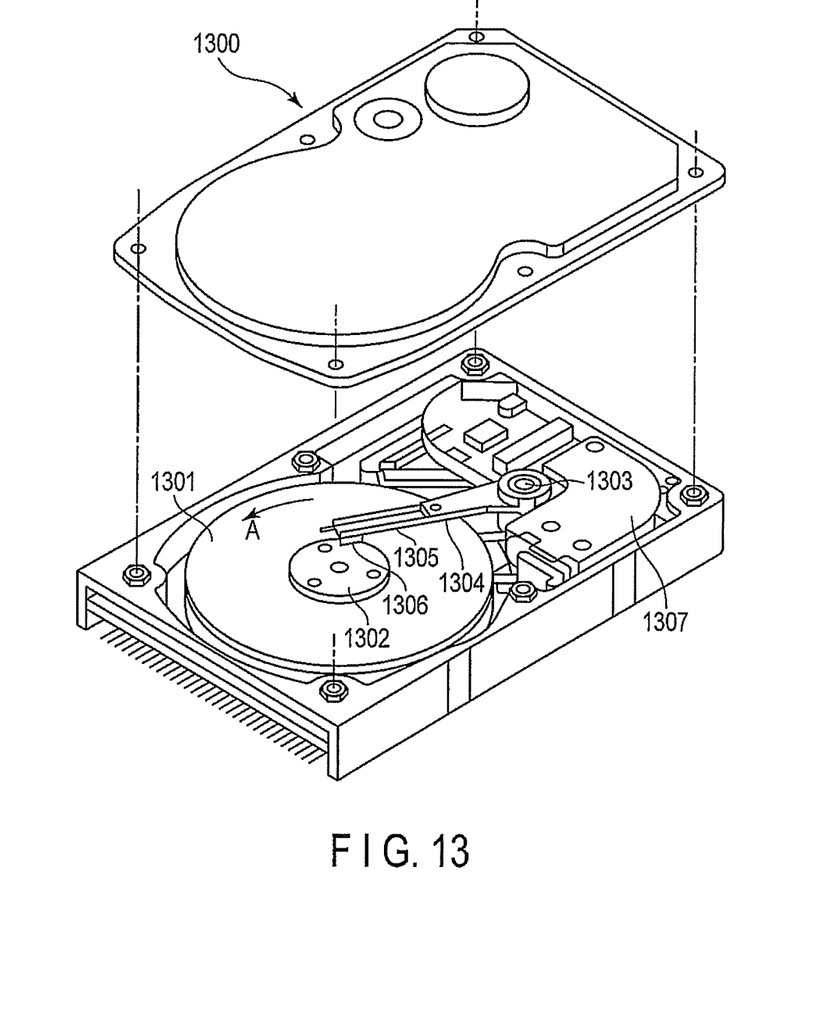
FIG. 13 is a perspective view schematically showing a magnetic recording and reproducing apparatus according to the fifth embodiment.

FIG. 13 schematically shows a magnetic recording and reproducing apparatus (i.e., HDD) 1300 according to the fifth embodiment. As shown in FIG. 13, the magnetic recording and reproducing apparatus 1300 includes a magnetic disk 1301 as a magnetic recording medium. The magnetic disk 1301 is mounted on a spindle 1302, and rotated in the direction of an arrow A by a spindle motor. A pivot 1303 provided near the magnetic disk 1301 holds an actuator arm 1304. A suspension 1305 is attached to the distal end of the actuator arm 1304. A head slider 1306 is supported on the lower surface of the suspension 1305. A recording head and the STO reproducing head of each embodiment described above are mounted on the head slider 1306. A voice coil motor 1307 for moving the head slider 1306 to a given position in the radial direction of the magnetic disk 1301 is provided in the proximal end of the actuator arm 1304.

When the magnetic disk 1301 is rotated and the actuator arm 1304 is pivotally moved by the voice coil motor 1307 to load the head slider 1306 onto the magnetic disk 1301, the medium-facing surface of the head slider 1306 is held with a predetermined floating amount from the surface of the magnetic disk 1301. In this state, information recorded on the magnetic disk 1301 can be read out.

In at least one of the embodiments explained above, the spin-torque oscillator and shield film are arranged such that the distance between the medium-facing surface of the spin-torque oscillator and the surface of the magnetic recording medium is shorter than that between the medium-facing surface of the shield film and the surface of the magnetic recording medium. This reduces magnetic fields from adjacent bits acting on the oscillation layer. Consequently, the inter-bit interference noise in a reproduced signal can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reproducing head with a spin-torque oscillator, the head comprising:
    the spin-torque oscillator having a first surface facing a magnetic recording medium, the spin-torque oscillator used to detect a magnetic field from the magnetic recording medium; and
    a pair of shield parts each having a second surface facing the magnetic recording medium, the spin-torque oscillator being arranged between the shield parts,
    wherein a distance between the second surface and the magnetic recording medium is shorter than a distance between the first surface and the magnetic recording medium.

2. The head according to claim 1, further comprising an insulating layer formed in a portion enclosed by the pair of shield parts, the insulating layer having a third surface facing the magnetic recording medium,
    wherein the third surface is flush with the second surface.

3. The head according to claim 1, wherein the spin-torque oscillator comprises a multilayered structure including an oscillation layer having rotatable magnetization.

4. The head according to claim 3, wherein the oscillation layer is arranged in a center between the pair of shield parts.

5. The head according to claim 3, further comprising a bias magnetic field source configured to apply a bias magnetic field to the oscillation layer.

6. The head according to claim 5, wherein the oscillation layer has a first axis defined in a longitudinal direction of a film surface of the oscillation layer, and a second axis defined in a lateral direction of the film surface, and is formed such that the second axis is parallel to a direction in which a medium magnetic field generated from the magnetic recording medium acts on the oscillation layer.

7. A magnetic recording and reproducing apparatus comprising the reproducing head with the spin-torque oscillator according to claim 1, and the magnetic recording medium.

* * * * *